United States Patent
Schultz

(10) Patent No.: US 8,297,342 B2
(45) Date of Patent: Oct. 30, 2012

(54) HEAT SINK ASSEMBLY

(75) Inventor: Mark Delorman Schultz, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 786 days.

(21) Appl. No.: 12/493,319

(22) Filed: Jun. 29, 2009

(65) Prior Publication Data

US 2010/0326626 A1     Dec. 30, 2010

(51) Int. Cl.
*F28F 7/02* (2006.01)

(52) U.S. Cl. .................... 165/80.4; 165/154; 165/80.2

(58) Field of Classification Search ............ 165/80.1, 165/80.2, 80.4, 80.5, 104.19, 104.33, 154, 165/155; 118/724, 729; 29/25.01; 269/25, 269/32, 310

See application file for complete search history.

(56) References Cited

U.S. PATENT DOCUMENTS

| | | | | |
|---|---|---|---|---|
| 4,949,783 A * | 8/1990 | Lakios et al. | ......... | 165/80.1 |
| 5,228,501 A * | 7/1993 | Tepman et al. | ......... | 165/80.1 |
| 5,810,933 A * | 9/1998 | Mountsier et al. | ......... | 118/724 |
| 6,645,303 B2 * | 11/2003 | Frankel et al. | ......... | 118/725 |
| 6,705,394 B1 * | 3/2004 | Moslehi et al. | ......... | 165/206 |
| 6,935,466 B2 * | 8/2005 | Lubomirsky et al. | ......... | 187/250 |

* cited by examiner

*Primary Examiner* — Teresa Walberg

(74) *Attorney, Agent, or Firm* — Harrington & Smith

(57) ABSTRACT

A heat sink assembly including a first member having a heat transfer surface adapted to directly contact a device to be cooled; a second member including coolant channels and a separate fluid channel; and a connection which at least partially mechanically connects the first member to the second member. The connection includes three bellows forming three conduits between the channels in the second member and the first member. A second one of the bellows and a third one of the bellows are located inside a first one of the bellows.

21 Claims, 5 Drawing Sheets

HEAT SINK ASSEMBLY

BACKGROUND

1. Field of the Invention

The invention relates to heat transfer and, more particularly, to a heat sink assembly.

2. Brief Description of Prior Developments

Heat sinks, used for cooling of a device during a test, are known which are loaded against the device under test (DUT). This load is typically provided by a set of springs which compress as the DUT is brought into contact with the heat sink. The resulting load varies around some nominal value with compression varying both in the springs fundamental spring constants and in the distance traveled. The nominal load value is fixed (unless the springs are changed), resulting in widely varying load pressures for varying DUT sizes. The variations in load and in resulting load pressure result in less than optimal load design and, thus, less than optimal thermal performance. This issue is aggravated when the heat sink is a locally compliant type heat sink requiring a particular range of load pressures for best performance. In addition, many typical (although not all) heat sink mounting designs can have unbalanced loads created by the coolant delivery hoses. Some applications now utilize a centrally located dual bellows system for bringing in and returning the coolant. The load in this case can be substantially dependent on coolant flow, with no means for compensating for these variations.

BRIEF SUMMARY

The following summary is merely intended to be exemplary. The summary is not intended to limit the scope of the claimed invention.

In accordance with one aspect of the invention, a heat sink assembly is provided including a first member having a heat transfer surface adapted to directly contact a device to be cooled; a second member including coolant channels and a separate fluid channel; and a connection which at least partially mechanically connects the first member to the second member. The connection includes three bellows forming three conduits between the channels in the second member and the first member. A second one of the bellows and a third one of the bellows are located inside a first one of the bellows. The pneumatic fluid carried in the separate fluid channel may be gaseous or liquid or both.

In accordance with another aspect of the invention, a heat sink assembly is provided comprising a first member adapted to directly contact a device to be cooled; a second member comprising coolant channels and a pneumatic fluid channel; and a first bellows between the pneumatic fluid channel in the second member and the first member. The bellows and the first member are adapted to use pneumatic fluid to push the first member against the device.

In accordance with another aspect of the invention, a method is provided comprising providing a first member with a heat transfer surface adapted to directly contact a device to be cooled; providing a second member comprising coolant channels and a separate pneumatic fluid channel; and connecting the first member to the second member by a connection comprising three bellows forming three conduits connected to the channels in the second member, wherein a second one of the bellows and a third one of the bellows are located inside a first one of the bellows.

In accordance with another aspect of the invention, a method is provided comprising providing a heat sink assembly with a first member connected to a second member by a plurality of bellows, wherein the second member comprises coolant channels and a pneumatic fluid channel, wherein the pneumatic fluid channel is connected to the first member by a pneumatic fluid conduit formed by a first one of the bellows separate from coolant conduits formed by a second and a third one of the bellows, and wherein the first member comprises a heat transfer surface for directly contacting a device to be cooled; aligning the heat transfer surface of the first member on the device; and after the heat transfer surface has been aligned on the device, increasing pressure of the first member against the device by pneumatic fluid from the second member to the pneumatic fluid conduit.

BRIEF DESCRIPTION OF THE SEVERAL VIEWS OF THE DRAWINGS

The foregoing aspects and other features of the invention are explained in the following description, taken in connection with the accompanying drawings, wherein.

DETAILED DESCRIPTION

Figure 1:
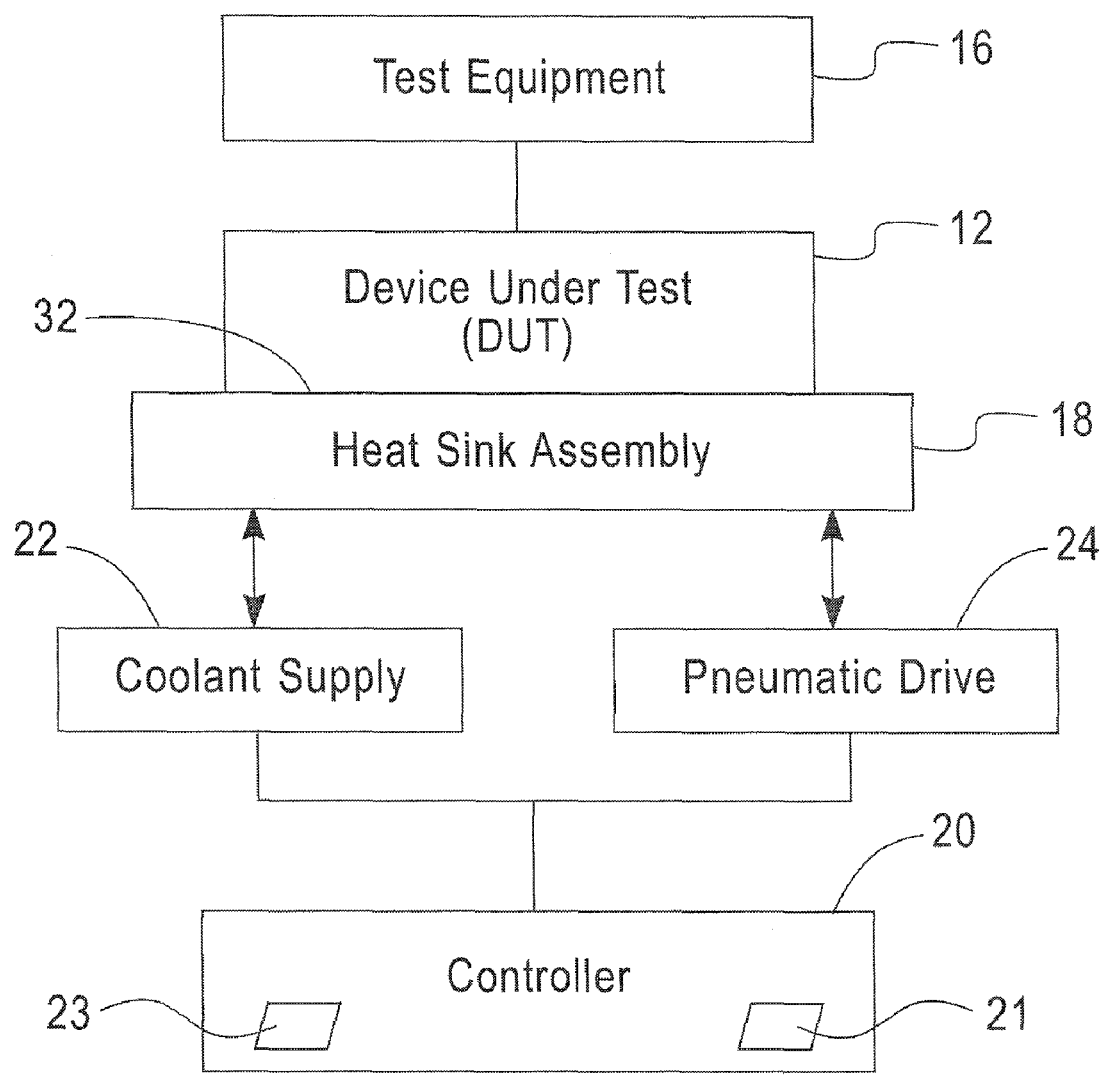
FIG. 1 is a diagram illustrating a testing system incorporating features of the invention.

Referring to FIG. 1, there is shown a diagram illustrating a testing system 10 for testing a device under test (DUT) 12. The testing system 10 includes a device cooling system 14 incorporating features of the invention. Although the invention will be described with reference to the example embodiments shown in the drawings, it should be understood that the invention can be embodied in many alternate forms of embodiments. In addition, any suitable size, shape or type of elements or materials could be used.

The device 12 could be an electronic device such as a computer chip or semiconductor for example. The testing system 10 comprises test equipment 16 which is connected to the device 12. During testing the device 12 will generate heat. The cooling system 14 is provided to cool the device 12 during testing. In this example embodiment the cooling system 14 comprises a heat sink assembly 18, a controller 20, a coolant supply 22 and a pneumatic drive 24. The controller 20 could be part of the controller used in the test equipment 16. The controller 20 could comprise a computer with a processor and a memory for example.

Figure 2:
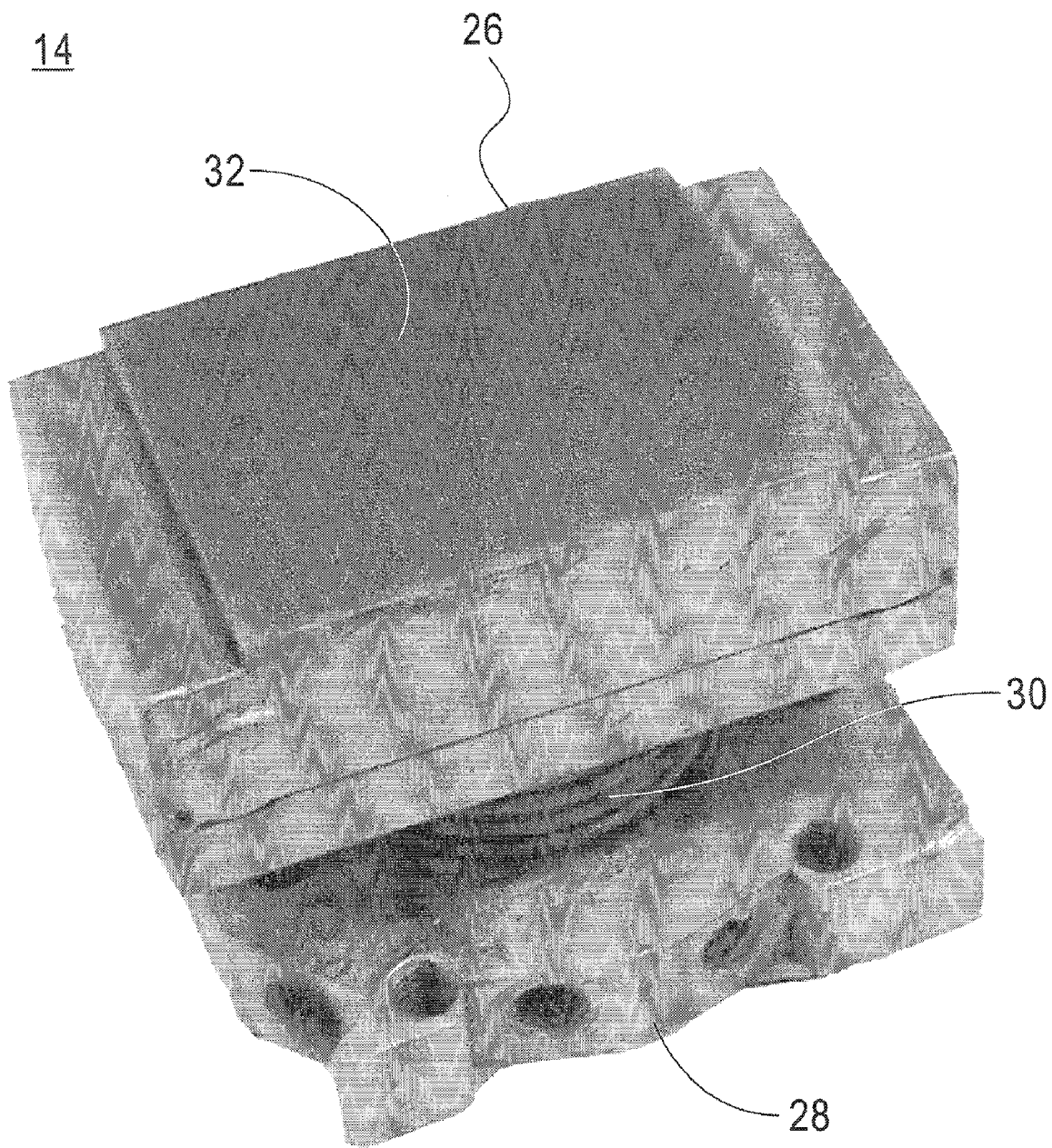
FIG. 2 is a perspective view of the heat sink assembly shown in FIG. 1.
Figure 3:
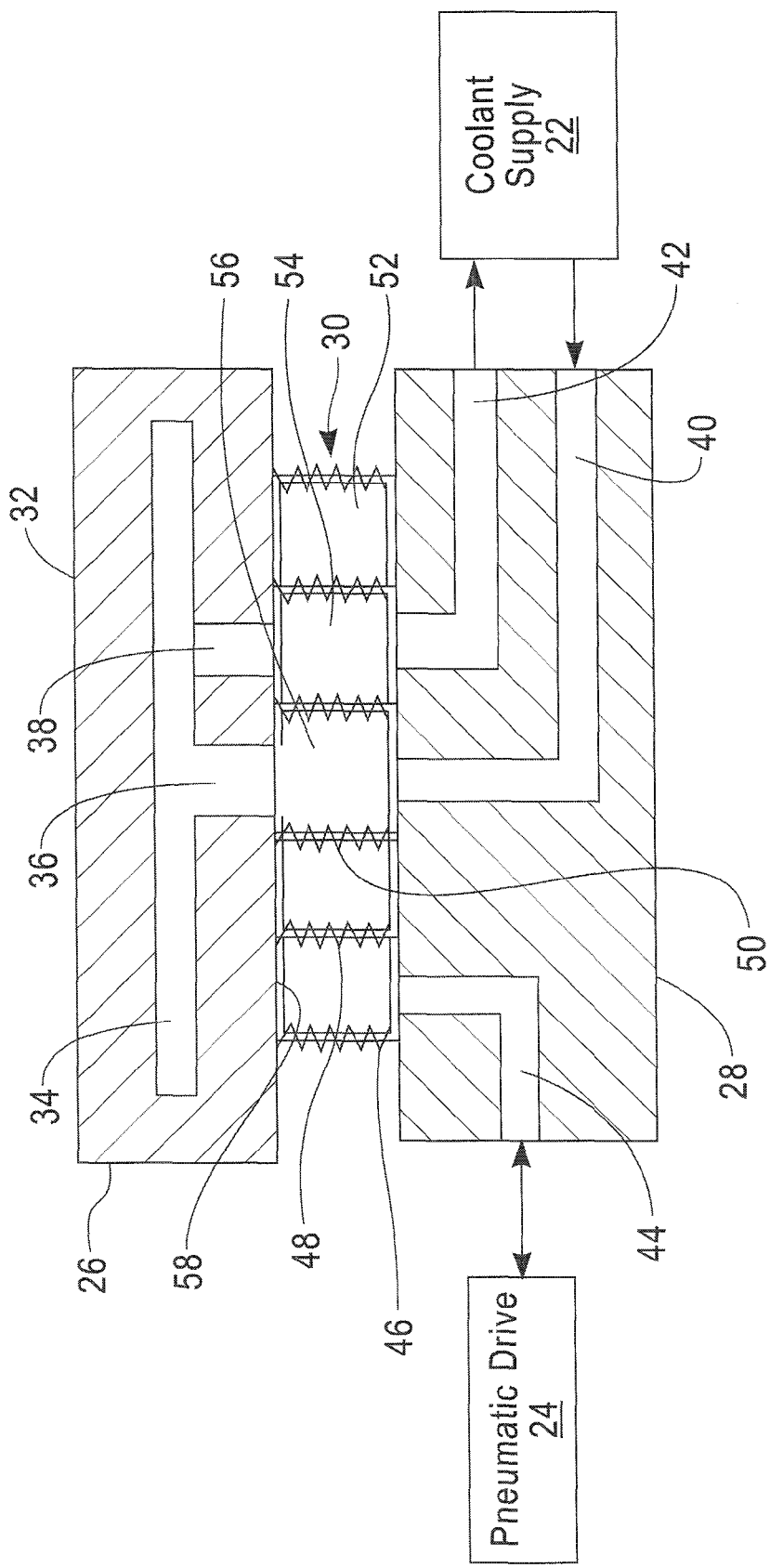
FIG. 3 is a schematic cross sectional view of the heat sink assembly shown in FIG. 2.

Referring also to FIG. 2, the heat sink assembly 14 generally comprises a first member 26, a second member 28 and a bellows arrangement 30. The first member 26 forms a heat sink with a heat transfer surface 32 on a front side of the first member 26. The heat transfer surface 32 is adapted to directly contact the device 12. Referring also to FIG. 3, the first member 26 comprises at least one coolant channel 34 with an inlet 36 and at least one coolant outlet 38.

The second member 28 forms a manifold. More particularly, the second member 28 comprises coolant channels 40, 42 and a pneumatic fluid channel 44. The coolant channels 40, 42 are connected to the coolant supply 22. The pneumatic fluid channel 44 is connected to the pneumatic drive 24.

Figure 4:
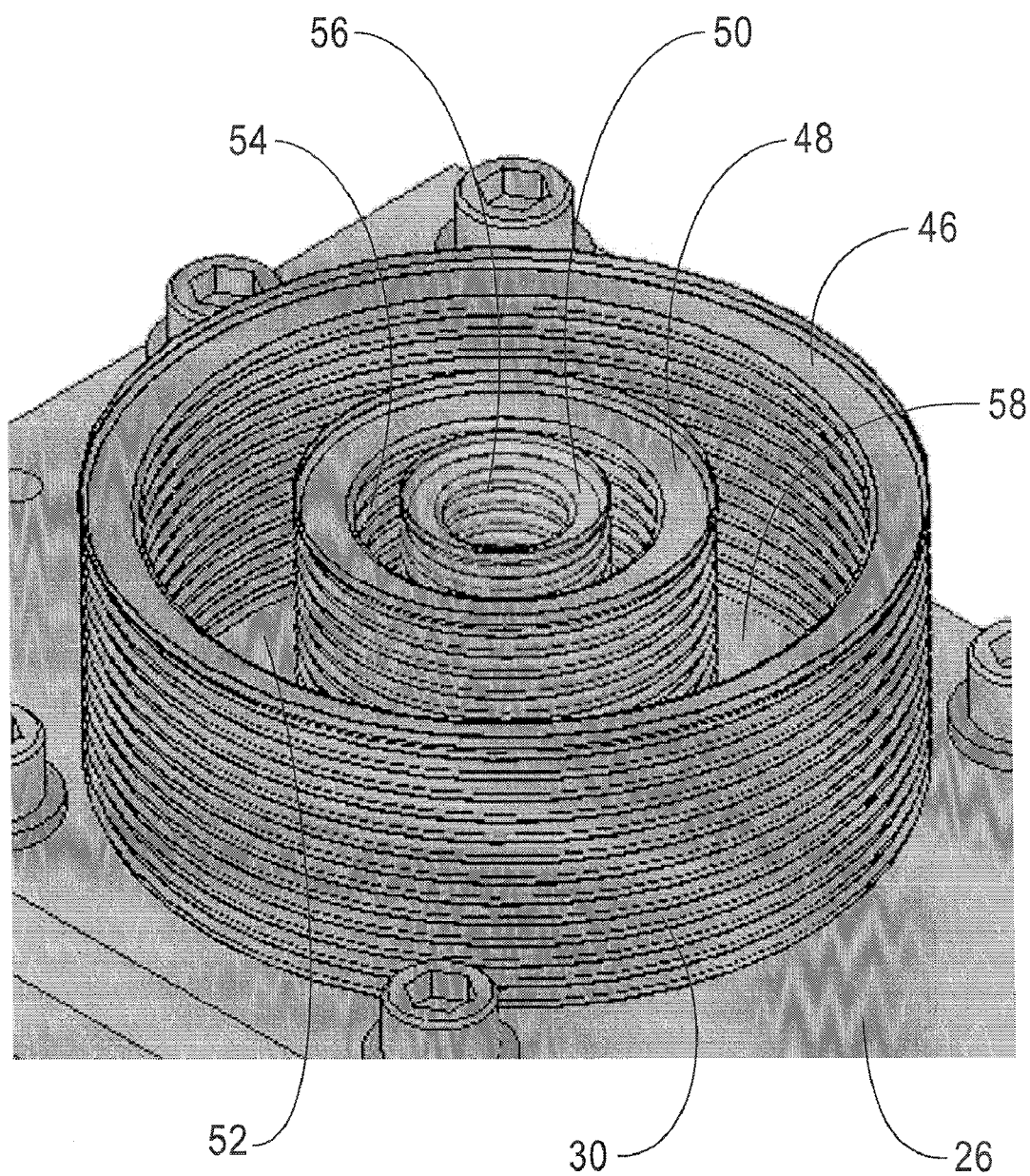
FIG. 4 is a perspective view of the bellows of the heat sink assembly shown in FIGS. 2-3.

The bellows arrangement 30 mechanically connects the first member 26 to the second member 28. Referring also to FIG. 4, in this example embodiment the bellows arrangement 30 comprises three bellows; a first bellows 46, a second bellows 48, and a third bellows 50. However, in alternate embodiments more than three bellows could be provided. The bellows 46-50 are comprised of nickel metal, but could be comprises of a flexible rubber or polymer material. The bellows 46-50 provide flexible conduits 52, 54, 56 between the first and second members 26, 28. The first conduit 52 is formed between the first and second bellows 46, 48. The second conduit 54 is formed between the second and third bellows 48, 50. The third conduit 56 is formed inside the third bellows 50. In an alternate embodiment one or more of the bellows could be replaced by a suitable alternative flexible conduit. In this example embodiment the three bellows 46-50 are concentrically arranged relative to one another.

The manifold function provided by the second member 28 allows coolant from the coolant supply 22 to be supplied to coolant channel 40 and into the third conduit 56 formed by the third bellows 50. This coolant can then enter the first member 26 at the inlet 36, flow through the coolant channel 34, and exit into the second conduit 54 at the outlet 38. The exiting coolant can flow through the second conduit 54 into the coolant channel 42 and back to the coolant supply 22. With the heat transfer surface 32 against the device 12, the heat transfer assembly 18 can remove heat from the device 12 during testing.

The heat sink 26 is loaded against the device under test (DUT) 12. This load is primarily controlled by the pneumatic pressure in the first conduit 52. This load can be independent of the size of the DUT 12. With a non-varying load and repeatable consistent load pressure, optimal load design can be provided and, thus, optimal thermal performance.

This issue is most advantageous when the heat sink is a locally compliant type of heat sink requiring a particular range of load pressures for best performance. In addition, with the heat sink mounting design a balanced load is created by the pneumatic pressure in the relatively large area of the first conduit 52 against the rear side 58 of the heat sink 26.

The invention can comprise a triple concentric bellows mounting scheme, with a first bellows connected to variable pressure air, a second bellows carrying the coolant out, a third bellows carrying the coolant in. The pressure can be set to provide a desired load for a specific device under test (DUT). This design provides for a well centered, adjustable load not provided by any other system currently in use. It dispenses with the pins necessary to align springs in conventional designs; instead aligning the heat sink to the DUT primarily with the structural rigidity (in the lateral directions) of the triple concentric bellows.

Air (or any other gas or liquid) can be supplied at a regulated pressure to the outer bellows. Nominally, this pressure is transferred to the load by the area on the back of the heat sink located between the outer and middle bellows (force equals pressure times area; F=PA). This load choice can be made based upon the size of the DUT and the desired DUT load pressure or load force.

Typically the heat sink would be gently brought into contact with the DUT, allowing the heat sink's heat transfer surface to align with the DUT surface with nearly no rotational forces. The air pressure would then be applied to load to the desired force/pressure. Conventional spring based systems, on the other hand, must typically be substantially preloaded to avoid even larger variations in force with the often limited available load travel. The preload in a conventional system can exert large corner forces on both the DUT and heat sink during load if the heat sink surface and DUT surface are not well aligned. With the invention, applying significant load only after the surfaces are aligned avoids this problem; preventing both heat sink and DUT damage.

Some load will be generated by the coolant inlet and outlet pressures as well. These pressures result in much smaller, though non-zero, loads due to the much smaller areas on the back of the heat sink. However, even these loads can be precisely compensated for by measuring the inlet and outlet pressures, computing the resulting force, and reducing the air pressure so that the total force or pressure is the desired, target force or pressure.

One additional advantage of this triple bellows system over a conventional dual bellows coolant only system is that a failure in the outer coolant bellows does not result in coolant sprayed all over the inside of the test equipment. It merely (in most cases) would result in air being forced into the coolant in small quantities, a much easier failure to address.

Figure 5:
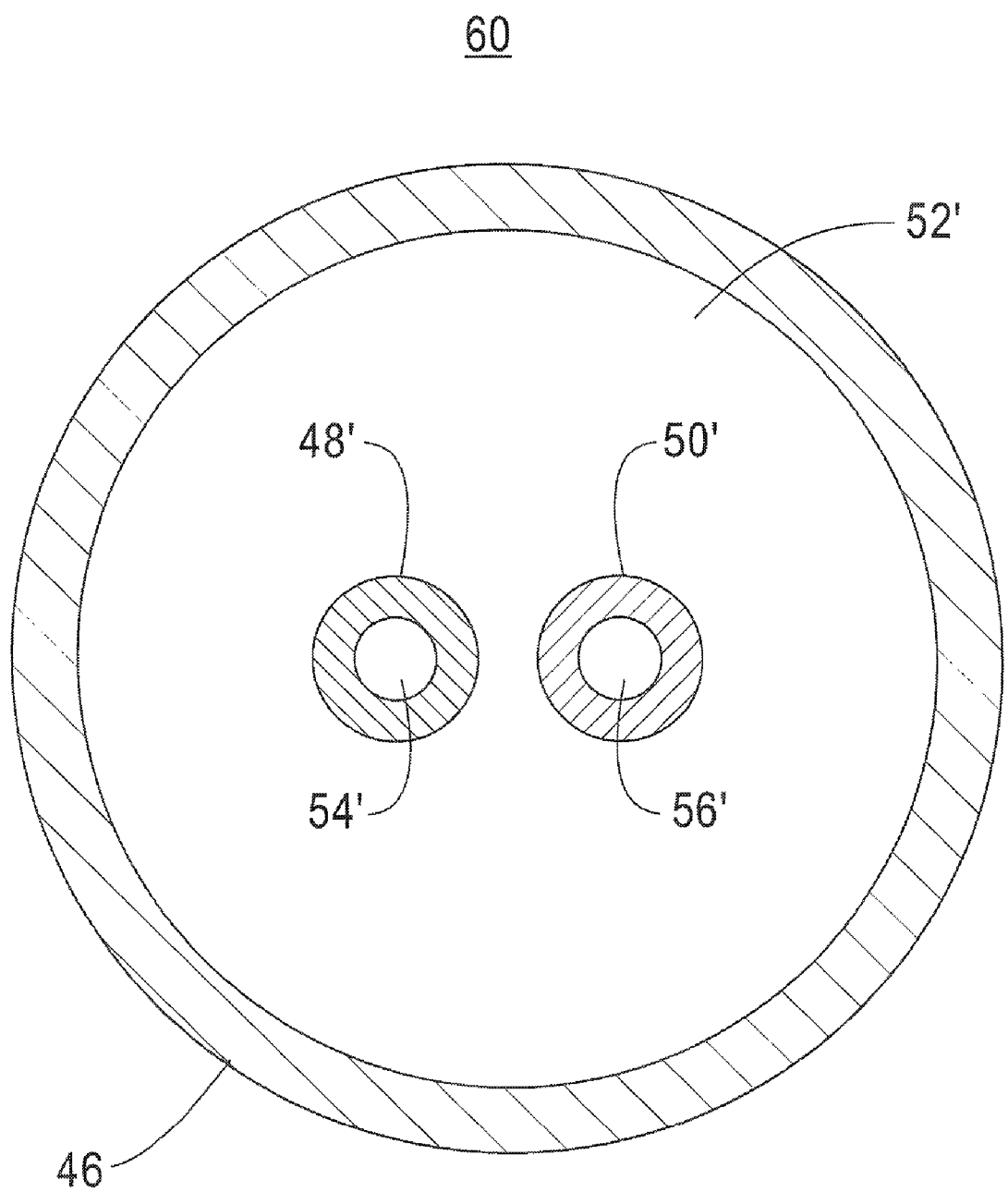
FIG. 5 is a cross sectional view of an alternate embodiment of a bellows arrangement for a heat sink assembly.

Referring also to FIG. 5, an alternate embodiment of the bellows connection between the first and second members is shown. In this embodiment the connection 60 comprises the first bellows 46, a second bellows 48' and a third bellows 50'. The second and third bellows 48', 50' are both located inside the first bellows 46, but are not concentric. However, in an alternate embodiment one of the second or third bellows could be concentric with the first bellows. The three bellows form three conduits 52', 54' and 56'. The first conduit 52' is for pneumatic pressurized fluid. The second and third conduits 54', 56' are for supply and return of coolant between the first and second members.

With one form of the invention a method can be provided comprising providing a first member with a heat transfer surface adapted to directly contact a device to be cooled; providing a second member comprising coolant channels and a separate pneumatic fluid channel; and connecting the first member to the second member by a connection comprising three bellows forming three conduits connected to the channels in the second member, wherein a second one of the bellows and a third one of the bellows are located inside a first one of the bellows. The three bellows can be generally concentric relative to one another. The conduits can comprise a first pneumatic fluid conduit connected to the pneumatic fluid channel in the second member, and two separate coolant conduits respectively connected to the coolant channels in the second member.

With one form of the invention a method can be provided comprising providing a heat sink assembly with a first member connected to a second member by a plurality of bellows, wherein the second member comprises coolant channels and a pneumatic fluid channel, wherein the pneumatic fluid channel is connected to the first member by a pneumatic fluid conduit formed by a first one of the bellows separate from coolant conduits formed by a second and a third one of the bellows, and wherein the first member comprises a heat transfer surface for directly contacting a device to be cooled; aligning the heat transfer surface of the first member on the device; and after the heat transfer surface has been aligned on the device, increasing pressure of the first member against the device by pneumatic fluid from the second member to the pneumatic fluid conduit. The method can further comprise moving the first member relative to the second member by pneumatic pressure between the first bellows and the second bellows. The heat sink can be a locally compliant heat sink, and the method can further comprise varying force of the first member against the device by varying pressure of the pneumatic fluid in the pneumatic fluid conduit to provide a range of load pressures of the heat sink against the device. Varying the force can be controlled by the controller 20. The memory 21 of the controller 20 can have suitable software stored for the processor 23 to perform the control features and vary the load/force by controlling the pneumatic drive 24.

It should be understood that the foregoing description is only illustrative of the invention. Various alternatives and modifications can be devised by those skilled in the art without departing from the invention. For example, features recited in the various dependent claims could be combined with each other in any suitable combination(s). In addition, features from different embodiments described above could be selectively combined into a new embodiment. Accordingly, the invention is intended to embrace all such alternatives, modifications and variances which fall within the scope of the appended claims.

What is claimed is:

1. A heat sink assembly comprising:
    a first member having a heat transfer surface adapted to directly contact a device to be cooled;
    a second member comprising coolant channels and a separate fluid channel; and
    a connection which at least partially mechanically connects the first member to the second member, wherein the connection comprises three bellows forming three conduits between the channels in the second member and the first member, and wherein a second one of the bellows and a third one of the bellows are located inside a first one of the bellows.

2. A heat sink assembly as in claim 1 wherein the heat transfer surface is located at a front side of the first member, and wherein the bellows are connected to an opposite rear side of the first member.

3. A heat sink assembly as in claim 1 wherein the first member comprises a coolant channel connected to two of the conduits.

4. A heat sink assembly as in claim 1 wherein at least two of the bellows are generally concentrically arranged relative to each other.

5. A heat sink assembly as in claim 1 wherein the three bellows are generally concentrically arranged relative to one another.

6. A heat sink assembly as in claim 5 wherein a first one of the conduits is formed between the first bellows and the second bellows, and wherein the first conduit is adapted to receive pressurized gas from the fluid channel of the second member.

7. A heat sink assembly as in claim 6 wherein a second one of the conduits is formed between the second bellows and the third bellows, wherein a third one of the conduits is formed inside the third bellows, and wherein the second and third conduits provide paths for coolant to travel between the coolant channels in the second member and the first member.

8. A heat sink assembly as in claim 1 further comprising means for moving the first member relative to the second member to push the first member against the device.

9. A heat sink assembly comprising:
    a first member adapted to directly contact a device to be cooled;
    a second member comprising coolant channels and a pneumatic fluid channel; and
    a first bellows between the pneumatic fluid channel in the second member and the first member, wherein the bellows and the first member are adapted to use pneumatic fluid to push the first member against the device.

10. A heat sink assembly as in claim 9 further comprising a second bellows located inside the first bellows, wherein the first and second bellows form a pneumatic fluid conduit therebetween.

11. A heat sink assembly as in claim 10 further comprising a third bellows located inside the second bellows, wherein the second and third bellows form a coolant conduit therebetween.

12. A heat sink assembly as in claim 10 further comprising a third bellows located inside the first bellows, wherein the second and third bellows form two spaced coolant conduits.

13. A heat sink assembly as in claim 9 wherein a heat transfer surface is located at a front side of the first member, and wherein the first bellows is connected to an opposite rear side of the first member.

14. A heat sink assembly as in claim 9 wherein the first member comprises a coolant channel connected to two coolant conduits between the first and second members.

15. A heat sink assembly as in claim 9 further comprising at least one additional bellows between the first and second member, wherein the at least one additional bellows and the first bellows are generally concentrically arranged relative to each other.

16. A method comprising:
    providing a first member with a heat transfer surface adapted to directly contact a device to be cooled;
    providing a second member comprising coolant channels and a separate pneumatic fluid channel; and
    connecting the first member to the second member by a connection comprising three bellows forming three conduits connected to the channels in the second member, wherein a second one of the bellows and a third one of the bellows are located inside a first one of the bellows.

17. A method as in claim 16 wherein the three bellows are generally concentric relative to one another.

18. A method as in claim 16 wherein the conduits comprise a first pneumatic fluid conduit connected to the pneumatic fluid channel in the second member, and two separate coolant conduits respectively connected to the coolant channels in the second member.

19. A method comprising:
    providing a heat sink assembly with a first member connected to a second member by a plurality of bellows, wherein the second member comprises coolant channels and a pneumatic fluid channel, wherein the pneumatic fluid channel is connected to the first member by a pneumatic fluid conduit formed by a first one of the bellows separate from coolant conduits formed by a second and a third one of the bellows, and wherein the first member comprises a heat transfer surface for directly contacting a device to be cooled;
    aligning the heat transfer surface of the first member on the device; and
    after the heat transfer surface has been aligned on the device, increasing pressure of the first member against the device by pneumatic fluid from the second member to the pneumatic fluid conduit.

20. A method as in claim 19 further comprising moving the first member relative to the second member by pneumatic pressure between the first bellows and the second bellows.

21. A method as in claim 19 wherein the heat sink is a locally compliant heat sink, and the method further comprises varying force of the first member against the device by varying pressure of the pneumatic fluid in the pneumatic fluid conduit to provide a range of load pressures of the heat sink against the device.

* * * * *